US010306785B1

(12) United States Patent
Chuang et al.

(10) Patent No.: US 10,306,785 B1
(45) Date of Patent: May 28, 2019

(54) DISPLAY DEVICE

(71) Applicant: PEGATRON CORPORATION, Taipei (TW)

(72) Inventors: Hsin-Lin Chuang, Taipei (TW); Kuo-Jung Hsu, Taipei (TW); Shih-Wei Hung, Taipei (TW); Wen-Chang Chuang, Taipei (TW); Feng-Yuan Yang, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 16/117,034

(22) Filed: Aug. 30, 2018

(30) Foreign Application Priority Data

Nov. 15, 2017 (TW) .............................. 106139576 A

(51) Int. Cl.
*H05K 5/00* (2006.01)
*H05K 5/02* (2006.01)
*H05K 1/14* (2006.01)
*H05K 1/02* (2006.01)

(52) U.S. Cl.
CPC .......... *H05K 5/0017* (2013.01); *H05K 1/147* (2013.01); *H05K 5/0226* (2013.01); *H05K 1/028* (2013.01); *H05K 5/0086* (2013.01); *H05K 2201/10037* (2013.01); *H05K 2201/10128* (2013.01)

(58) Field of Classification Search
USPC ........................................ 361/749, 748, 750
See application file for complete search history.

(56) References Cited

U.S. PATENT DOCUMENTS

2012/0307423 A1    12/2012    Bohn et al.

FOREIGN PATENT DOCUMENTS

TW          I566214 B       1/2017

OTHER PUBLICATIONS

Office Action issued in corresponding Taiwan Patent Application No. 106139576 dated Jul. 23, 2018.

*Primary Examiner* — Andargie M Aychillhum
(74) *Attorney, Agent, or Firm* — McClure, Qualey & Rodack, LLP

(57) ABSTRACT

A display device includes a flexible display panel and a housing. The housing includes connectors and couplers. Each of the connectors includes two accommodating slots. The connectors and the couplers are sequentially arranged in a staggered manner and connected with one another. Each of the couplers includes a coupling body and two cylinders. The two cylinders are connected to two sides of the coupling body. Each of the cylinders is disposed in the accommodating slot of the adjacent connector. A radial interval of an opening of the accommodating slot is greater than a thickness of the coupling body and is less than a diameter of the cylinder. While the housing is being bent along with the flexible display panel, the adjacent two connectors are being away from each other until the cylinder in the accommodating slot is blocked by the corresponding opening.

9 Claims, 6 Drawing Sheets ical Field

The instant disclosure relates to a display device and, more particularly, to a flexible display device with flexible display screen.

Related Art

Along with smart display devices being more popular, conventional display devices are gradually modified into display devices with touch display panels utilized for display interface and main control to replace physical buttons. In addition, while flexible display panels have launched, touch display panels of electronic devices (e.g., laptop computers, phones, and wearable devices) may be configured to be bendable to a certain extent, and the size of the touch display panel is no longer limited. Nowadays, under the circumstances that electrical information is vast, technology of display panel is mature, and cost of display panel is lower, consumers prefer purchasing large scale display devices to increase comfortableness when using these display devices.

Nevertheless, the size of a display screen of a flat display device is limited because in a case that the display screen is too large, the display device is too hard to be carried and occupies too much space in storage. If the display device incorporated with flexible display panel is designed to be foldable, the display device only requires half of an area in carrying and can be unfolded to present a larger screen in using. Such display device not only requires the use of the flexible display panel but also requires a housing capable of being folded and bent, accordingly, such that advantages regarding features and functions of the flexible display panel can be exploited to the full.

SUMMARY

To address the above issue, an embodiment of the instant disclosure provides a display device comprising a flexible display panel and a housing. The housing comprises a plurality of connectors and a plurality of couplers. Each of the connectors comprises two accommodating slots. The connectors and the couplers are sequentially arranged in a staggered manner and connected with one another. Each of the couplers comprises a coupling body and two cylinders. The two cylinders are connected to two sides of the coupling body. Each of the cylinders is disposed in the accommodating slot of the adjacent connector. Wherein a radial interval of an opening of the accommodating slot is greater than a thickness of the coupling body and is less than a diameter of the cylinder. While the housing is being bent along with the flexible display panel, the adjacent two connectors are being away from each other until the cylinder in the accommodating slot is blocked by the corresponding opening.

Based upon the combination of the connectors and the couplers, the housing can form bendable structures at portions needing to be folded or bent. As a result, the display device incorporated with the flexible display panel as a whole can be folded for carrying or storing, such that advantages of the flexible display panel can be exploited, and the area of the display device can be decreased to facilitate carrying and storing. By adjustment of the number and size of the connectors and the couplers, the housing can be adapted to varied sizes of display devices, which is more convenient for design and application.

DETAILED DESCRIPTION OF THE EMBODIMENTS

Figure 1:
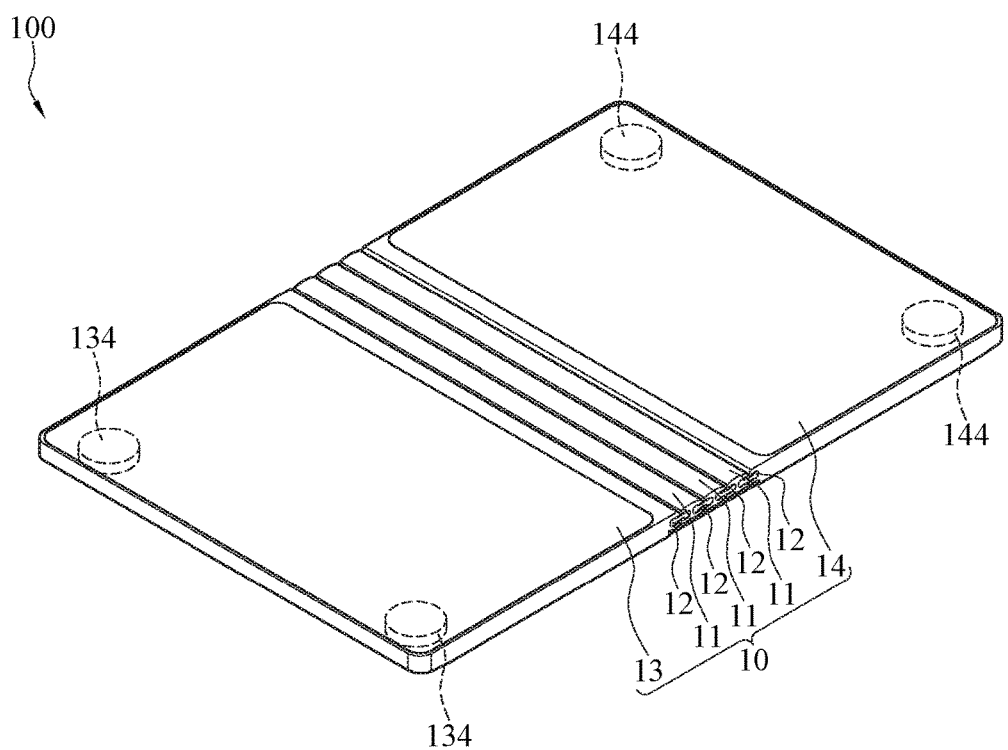
FIG. 1 illustrates a perspective view of the rear of a display device according to a first embodiment of the instant disclosure.
Figure 2:
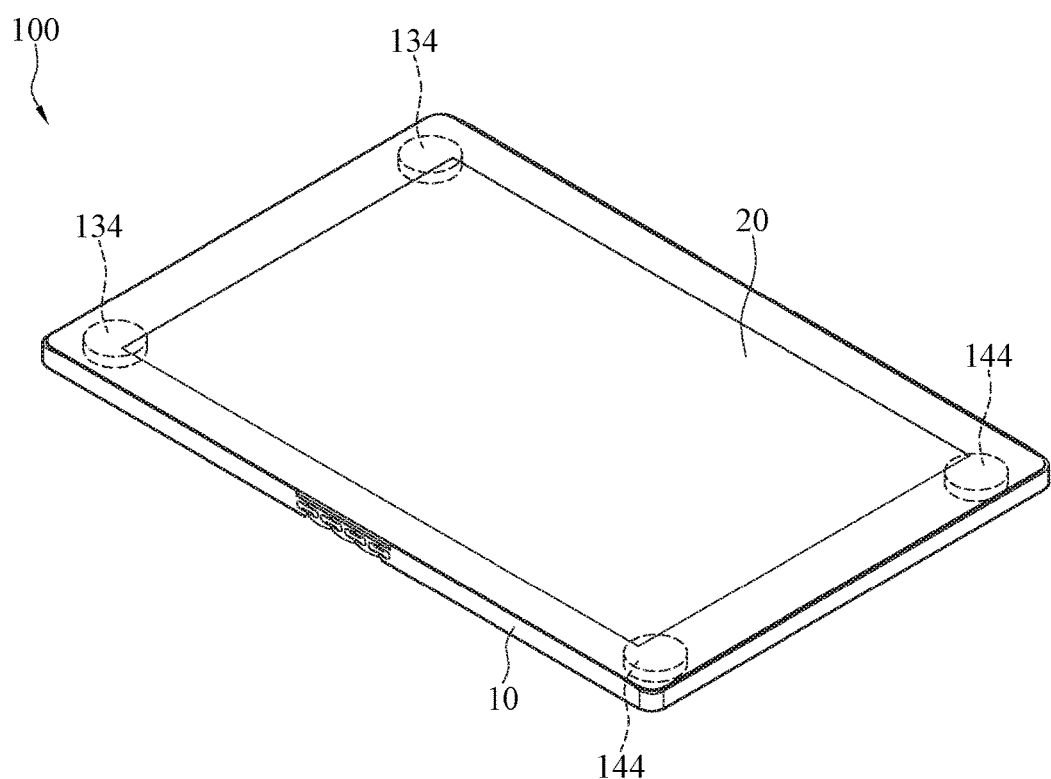
FIG. 2 illustrates a perspective view of the front of the display device according to the first embodiment of the instant disclosure.
Figure 3:
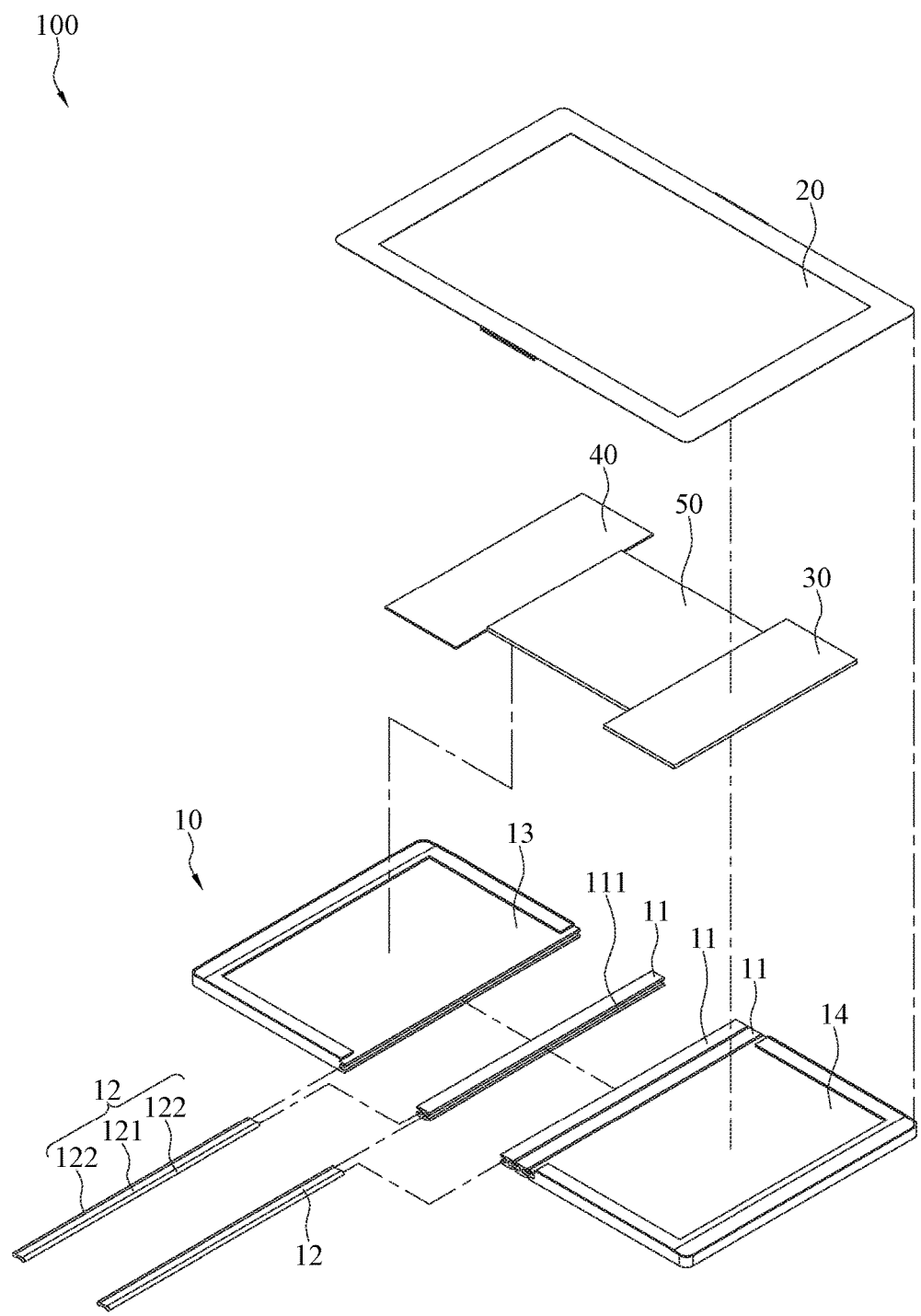
FIG. 3 illustrates an exploded view of the display device according to the first embodiment of the instant disclosure.
Figure 4:
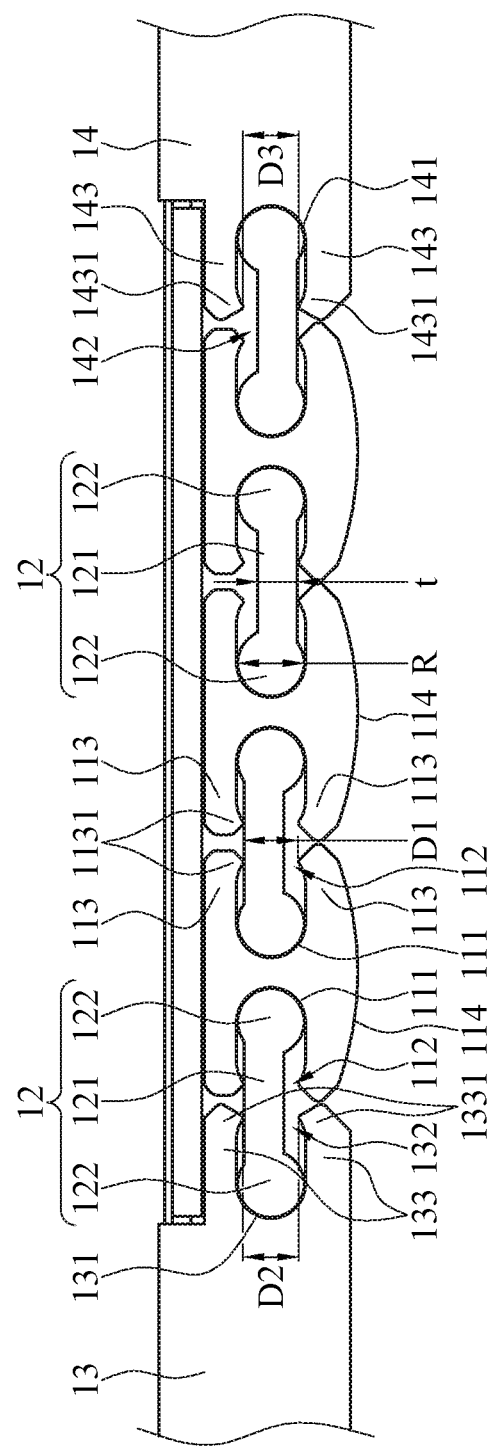
FIG. 4 illustrates a partially enlarged view of the display device while the housing is in a straight state according to the first embodiment of the instant disclosure.

Please refer to FIG. 1 to FIG. 4. FIG. 1 is a perspective view of the rear of a display device according to a first embodiment of the instant disclosure. FIG. 2 is a perspective view of the front of the display device according to the first embodiment of the instant disclosure. FIG. 3 is an exploded view of the display device according to the first embodiment of the instant disclosure. FIG. 4 is a partially enlarged view of the display device while the housing is in a straight state according to the first embodiment of the instant disclosure. In the embodiment, the display device 100 comprises a housing 10, a flexible display panel 20, a battery 30, a main board 40, and a flexible circuit board 50. The flexible display panel 20 is assembled to the housing 10. In the embodiment, the while of the housing 10 is, but is not limited to, assembled to the rear of the flexible display panel 20, such that a display area of the display device 100 can be as large as possible while a volume of the display device 100 can be as small as possible. The battery 30, the main board 40, and the flexible circuit board 50 are respectively disposed in the housing 10. The flexible circuit board 50 is respectively connected to the battery 30 and the main board 40. In addition, the flexible display panel 20 is electrically connected to the main board 40, such that electrical components (not shown) such as processor on the main board 40 can be used to control the flexible display panel 20.

Please refer to FIG. 1 to FIG. 4. In the embodiment, the housing 10 comprises a plurality of connectors 11, a plurality of couplers 12, a first plate 13, and a second plate 14. In some embodiments, the housing 10 only comprises the connectors 11 and the couplers 12 assembled to each other, and thus any part of the housing 10 is bendable. The invention is not limited to the above embodiments. In the embodiment, a middle part of the housing 10 is bendable and is provided with the connectors 11 and the couplers 12. In addition, two sides of the middle part are provided with the first plate 13 and the second plate 14 which are not bendable. As a result, the housing 10 can be bent by the middle part thereof in carrying or storing. In the embodiment, the connectors 11 and the couplers 12 are made of rubber with slight elasticity. While the housing 10 is bent, the connectors 11 and the couplers 12 may be elastically deformed to facilitate the bending process. The connectors 11 and the couplers 12 may also be made of material with weak elasticity. The invention is not limited to the above embodiments.

As show in FIG. 1 and FIG. 3, the connectors 11 and the couplers 12 are stripe-shaped. The first plate 13 is connected to one of the couplers 12 in advance, and then the connectors 11 and the couplers 12 are sequentially arranged in a staggered manner and connected with one another. That is to say, in the assembling process, one of the couplers 12 is connected to one of the connectors 11, and the connector 11 is connected to another one of the couplers 12. The connectors 11 and the couplers 12 are arranged in such sequence and connected to one another. The last coupler 12 at an end is connected to the second plate 14, such that the housing 10 is assembled.

In such manner of pivotally connection, the number of the connectors 11 and the couplers 12 can be determined based upon an arc radius of the housing 10 required in a bent state to be adapted to varied sizes of display devices. In addition, the embodiment illustrates that the first plate 13 is connected to the coupler 12. In other embodiments, the first plate 13 may be connected to the connector 11 in advance and then be connected to the coupler 12 and the connector 11 in sequence, and the second plate 14 may be connected to the connector 11 or the coupler 12 at last. In order to reduce the number of components required in the manufacturing process, the first plate 13 and the second plate 14 may have the same configuration. For instance, both of the first plate 13 and the second plate 14 are connected to the connector 11 or connected to the coupler 12.

The connector 11 comprises two accommodating slots 111. Each of the accommodating slots 111 comprises an opening 112 and two slot walls 113. As shown in FIG. 3 and FIG. 4, two sides of the connectors 11 are respectively provided with one accommodating slot 111. A left end and a right end of the two accommodating slots 111 of each of the connectors 11 are respectively provided with one opening 112. The slot walls 113 are at two sides of the opening 112 of each of the accommodating slots 111. The opening 112 has an interval D1 in a radial direction. In the embodiment, the accommodating slot 111 is U-shaped. But the shape is not limited to the above embodiment.

The coupler 12 comprises a coupling body 121 and two cylinders 122. The two cylinders 122 are connected to two sides of the coupling body 121. As shown in FIG. 3, in the embodiment, the cylinder 122 is disposed on the whole of the long side of the coupling body 121. In other embodiments, the cylinder 122 may be provided only in a middle part or in two opposite end parts of the long side of the coupling body 121. The function of the cylinder 122 is for the connector 11 and the coupler 12 being connected to each other, and thus it is not necessary that the cylinder 122 is disposed on the whole of the long side of the coupling body 121.

As shown in FIG. 4, the interval D1 of the opening 112 is greater than a thickness t of the coupling body 121 and is less than a diameter R of the cylinder 122. As a result, while the cylinder 122 is blocked by the opening 112, the connector 11 and the coupler 12 are incapable of being detached from each other even the connector 11 and the coupler 12 are forced to be moved away from each other. In addition, the cylinder 122 is incapable of being assembled into the accommodating slot 111 via the opening 112 since the diameter R of the cylinder 122 is greater than the interval D1 of the opening 112. Therefore, in the assembling process of the coupler 12, as shown in FIG. 3, the cylinder 122 of the coupler 12 is inserted into the accommodating slot 111 of the adjacent connector 11 from the front or the rear of the connector 11 to achieve the connection of the connector 11 and the coupler 12.

Since the cylinder 122 is incapable of being detached from the opening 112 while the accommodating slot 111 is capable of allowing the cylinder 122 to freely slide in the accommodating slot 111, the interval D1 of the opening 112 is less than the diameter R of the cylinder 122. In the embodiment, the slot wall 113 at two sides of the opening 112 of the accommodating slot 111 is curved inwardly, and thus an end of the slot wall 113 forms a curved portion 1131 curved inwardly towards the opening 112. The terms "inwardly" means the direction towards the middle of the accommodating slot 111 for receiving the cylinder 122. By the slot wall 113 being curved inwardly and slightly to form the curved portion 1131, the interval D1 of the opening 112 can be adjusted to be less than the diameter R of the cylinder 122 without any additional component or structure.

In other embodiments, the slot wall 113 at two sides of the opening 112 is provided with a blocking portion (not shown) protruded inwardly, such that the interval D1 of the opening 112 is less than the diameter R of the cylinder 122.

Please refer to FIG. 1 and FIG. 4. The display device 100 can be used in a flat state. In such case, the housing 10 is in a straight state. While the housing 10 is in a straight state, the coupler 12 is fully received in the accommodating slots 111 of the two adjacent connectors 11. That is to say, while observing from the outside of the housing 10, only the adjacent connectors 11 are visible, and the couplers 12 received in the accommodating slots 111 of each of the connectors 11 are invisible.

As shown in FIG. 1 to FIG. 4, the first plate 13 and the second plate 14 at the left and right sides of the housing 10 are also provided with corresponding structures connected with the couplers 12. As shown in FIG. 3 and FIG. 4, the first plate 13 of the embodiment is connected to the coupler 12, and thus a side of the first plate 13 connected to the coupler 12 is provided with an accommodating slot 131. The accommodating slot 131 comprises an opening 132 and slot walls 133. The opening 132 is provided on a right side of the accommodating slot 131. The slot walls 133 of the accommodating slot 131 are at two sides of the opening 132. The opening 132 has an interval D2 in a radial direction.

The interval D2 of the opening 132 of the first plate 13 is greater than the thickness t of the coupling body 121 and is less than the diameter R of the cylinder 122. As a result, after the first plate 13 and the coupler 12 are moved away from each other and the cylinder 122 is blocked by the opening 132, the first plate 13 and the coupler 12 are incapable of being detached from each other. In addition, the cylinder 122 is incapable of being assembled into the accommodating slot 131 via the opening 132 since the diameter R of the cylinder 122 is greater than the interval D2 of the opening 132. Therefore, in the assembling process of the coupler 12, as shown in FIG. 3, the cylinder 122 of the coupler 12 is inserted into the accommodating slot 131 of the adjacent first plate 13 from the front or the rear of the first plate 13 to achieve the connection of the first plate 13 and the coupler 12.

Since the cylinder 122 is incapable of being detached from the opening 132 while the accommodating slot 131 is capable of allowing the cylinder 122 to freely slide in the accommodating slot 131, the interval D2 of the opening 132 is less than the diameter R of the cylinder 122. In the embodiment, the slot wall 133 at two sides of the opening 132 of the accommodating slot 131 is curved inwardly, and thus an end of the slot wall 133 forms a curved portion 1331 curved inwardly towards the opening 132. The terms "inwardly" means the direction towards the middle of the accommodating slot 131 for receiving the cylinder 122. By the slot wall 133 being curved inwardly and slightly, the interval D2 of the opening 132 can be adjusted to be less than the diameter R of the cylinder 122 without any additional component or structure.

As shown in FIG. 4, the second plate 14 of the embodiment is analogously connected to the coupler 12, and thus the structures of the second plate 14 and the first plate 13 of the embodiment are the same. A side of the second plate 14 connected to the coupler 12 is provided with an accommodating slot 141. The accommodating slot 141 comprises an opening 142 and slot walls 143. The opening 142 is provided on a left side of the accommodating slot 141. The slot walls 143 of the accommodating slot 141 are at two sides of the opening 142. The opening 142 has an interval D3 in a radial direction. The interval D3 of the opening 142 of the second plate 14 is greater than the thickness t of the coupling body 121 and is less than the diameter R of the cylinder 122. As a result, after the second plate 14 and the coupler 12 are moved away from each other and the cylinder 122 is blocked by the opening 142, the second plate 14 and the coupler 12 are incapable of being detached from each other.

In addition, the cylinder 122 is incapable of being assembled into the accommodating slot 141 via the opening 142 since the diameter R of the cylinder 122 is greater than the interval D3 of the opening 142. Therefore, in the assembling process of the coupler 12, as the connector 11 and the first plate 13 are assembled, the cylinder 122 of the coupler 12 is inserted into the accommodating slot 141 of the adjacent second plate 14 from the front or the rear of the second plate 14 to achieve the connection of the second plate 14 and the coupler 12.

Since the cylinder 122 is incapable of being detached from the opening 142 while the accommodating slot 141 is capable of allowing the cylinder 122 to freely slide in the accommodating slot 141, the interval D3 of the opening 142 is less than the diameter R of the cylinder 122. In the embodiment, the slot wall 143 at two sides of the opening 142 of the accommodating slot 141 is curved inwardly, and thus an end of the slot wall 143 forms a curved portion 1431 curved inwardly towards the opening 142. The terms "inwardly" means the direction towards the middle of the accommodating slot 141 for receiving the cylinder 122. By the slot wall 143 being curved inwardly and slightly, the interval D3 of the opening 142 can be adjusted to be less than the diameter R of the cylinder 122 without any additional component or structure.

In other embodiments, the first plate 13 and the second plate 14 are respectively connected to the connectors 11. In such case, sides of the first plate 13 and the second plate 14 connected to the corresponding connectors 11 are respectively provided with the coupling bodies and the cylinders. The cylinder is inserted into the accommodating slot 111 of the connector 11 to achieve the assembling of the first plate 13 and the connector 11 or the second plate 14 and the connector 11.

Figure 5:
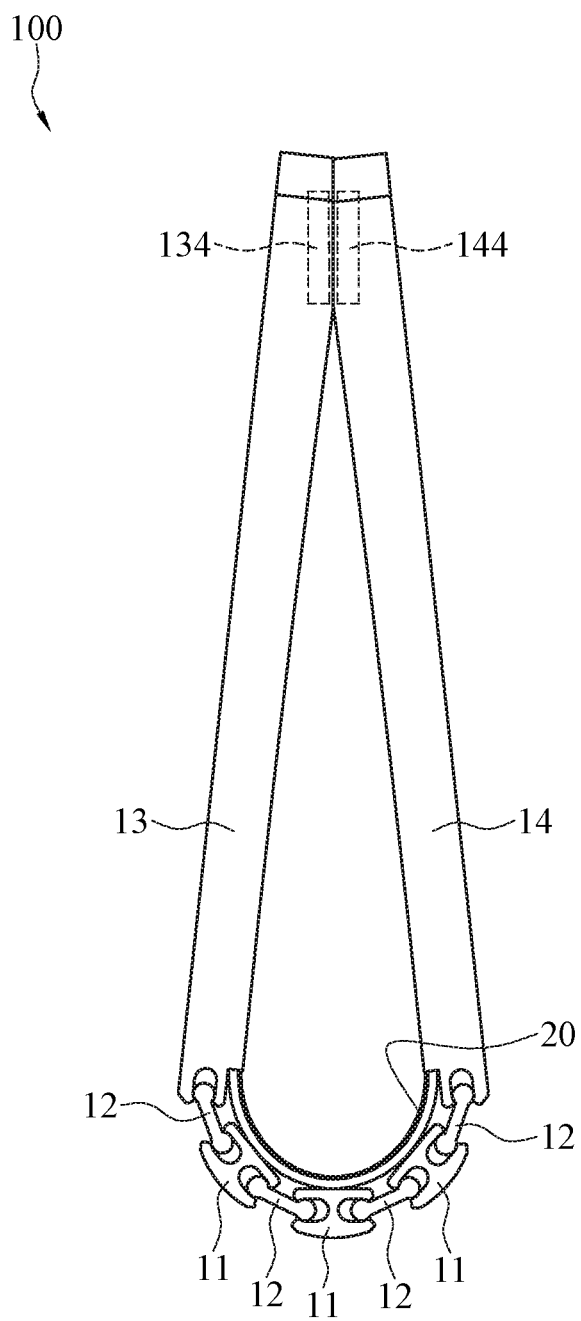
FIG. 5 illustrates a side view of the display device in a bent state according to the first embodiment of the instant disclosure.
Figure 6:
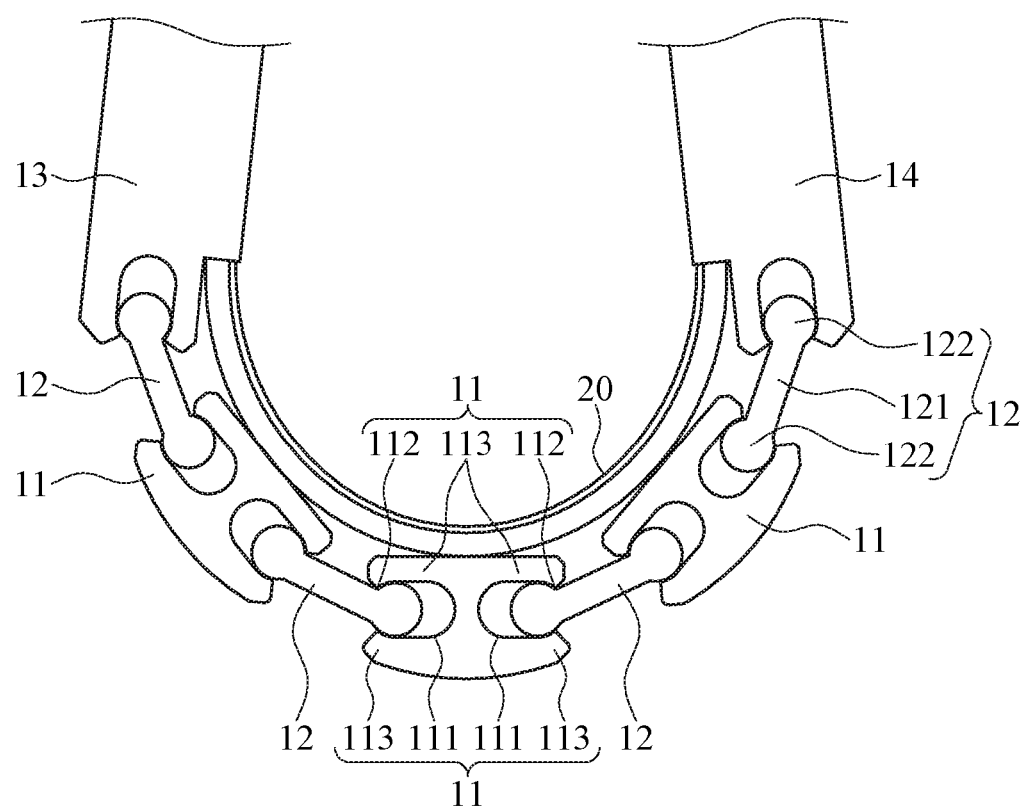
FIG. 6 illustrates a partially enlarged view of the display device in a bent state according to the first embodiment of the instant disclosure.

In addition, please refer to FIG. 5 and FIG. 6. FIG. 5 is a side view of the display device 100 in a bent state according to the first embodiment of the instant disclosure. FIG. 6 is a partially enlarged view of the display device 100 in a bent state according to the first embodiment of the instant disclosure. In the illustration, the display device 100 is folded for storing or carrying. While the display device 100 is folded, the housing 10 at outside needs to be stretched to a certain length to facilitate the flexible display panel 20 at inside to be bent. As shown in FIG. 5 and FIG. 6, while the display device 100 is being bent, the two adjacent connectors 11 are moving away from each other along with the bending of the housing 10 until the cylinder 122 disposed in the accommodating slot 111 is blocked by the opening 112 of the corresponding connector 11.

As illustrated by FIG. 6, the connector 11 in the middle, the coupler 12 on the right of the connector 11, and the connector 11 on the right of the coupler 12 are used for an example for the following illustration. For the convenience of illustration, the connector 11 on the right of the coupler 12 is referred to "the right connector 11," and the connector 11 in the middle is referred to "the connector 11." During the bending of the housing 10, the right connector 11 is being moved away from the connector 11. Along with the right connector 11 being moved away from the connector 11, the coupler 12 there between is being exposed, and the right connector 11 is continuously being moved until the cylinder 122 is blocked by the opening 112. In the meantime, while the housing 10 is continuously being bent, the right connector 11 is driving the coupler 12 to continuously move until the left cylinder 122 of the coupler 12 is blocked by the opening 112 of the connector 11.

As a result, by the connection of the connector 11 and the coupler 12, the housing 10 forms a bendable structure. While the housing 10 is bent, the housing 10 can stretch to a certain length (being about the length of the coupling body) and can be folded. Based upon the use of the flexible display panel 20 and the flexible circuit board 50 disposed corresponding to the connectors 11 and the couplers 12 to be electrically connected with electrical components in the first plate 13 and the second plate 14, the display device 100 as a whole can be bent and folded. The advantages of the flexible display panel 20 can be exploited. The display device 100 is easy for carrying and storing.

As shown in FIG. 4 and FIG. 6, an outer surface 114 of the connector 11 is arc-shaped. An arc radius of the outer surface 114 can be changed based upon the number of the connectors 11 and the size of a curved surface of a curved portion of the display device 100 being folded to improve the appearance. Damages caused by collisions in storing or carrying can be reduced to a certain extent.

In addition, as shown in FIG. 1, FIG. 2, and FIG. 5, the first plate 13 comprises two first magnetic components 134 disposed inside the first plate 13 at an end away from the coupler 12, the second plate 14 comprises two second magnetic components 144 disposed inside the second plate 14 at an end away from the coupler 12. The positions of the first magnetic components 134 in the first plate 13 and the second magnetic components 144 in the second plate 14 are corresponding to one another, such that the first magnetic components 134 correspondingly attract the second magnetic components 144 after the housing 10 is bent. As a result, after the display device 100 is bent and folded, the display device 100 can maintain the folded state by magnetic attraction, and thus the folded display device 100 is less likely to be unintentionally unfolded to the flat state by the resilience of the material.

What is claimed is:

1. A display device, comprising:
   a flexible display panel; and
   a housing assembled with the flexible display panel, the housing comprising:
   a plurality of connectors, each of the connectors comprising two accommodating slots; and
   a plurality of couplers, the connectors and the couplers being sequentially arranged in a staggered manner and connected with one another, each of the couplers comprising a coupling body and two cylinders, the two cylinders being connected to two sides of the coupling body, each of the cylinders being disposed in the accommodating slot of the adjacent connector;
   wherein a radial interval of an opening of the accommodating slot is greater than a thickness of the coupling body and is less than a diameter of the cylinder, and while the housing is being bent along with the flexible display panel, the adjacent two connectors are being away from each other until the cylinder in the accommodating slot is blocked by the corresponding opening.

2. The display device of claim 1, wherein while the housing is in a straight state, the coupler is fully received in the two adjacent connectors.

3. The display device of claim 1, wherein a slot wall at two sides of the opening of each of the accommodating slots is curved inwardly.

4. The display device of claim 1, wherein a slot wall at two sides of the opening of each of the accommodating slots is provided with a blocking portion protruded inwardly.

5. The display device of claim 1, wherein the housing further comprises a first plate and a second plate, the first plate is assembled to one of the couplers at an end, and the second plate is assembled to another one of the couplers at another end.

6. The display device of claim 5, wherein a side of the first plate adjacent to the coupler is provided with the accommodating slot, the cylinder of the corresponding coupler is inserted in the accommodating slot of the first plate; a side of the second plate adjacent to the coupler is provided with the accommodating slot, the cylinder of the corresponding coupler is inserted in the accommodating slot of the second plate.

7. The display device of claim 5, further comprising a battery, a main board, and a flexible circuit board, wherein the battery is disposed in the second plate, the main board is disposed in the first plate, and an end of the flexible circuit board is electrically connected to the battery and another end of the flexible circuit board is passed through the connectors and couplers and electrically connected to the main board.

8. The display device of claim 5, wherein an end of the first plate away from the coupler comprises at least one first magnetic component, an end of the second plate away from the coupler comprises at least one second magnetic component, and the first magnetic component attracts the second magnetic component after the housing is bent.

9. The display device of claim 1, wherein an outer surface of the connector is arc-shaped.

* * * * *